United States Patent
Kim

(10) Patent No.: US 7,554,396 B2
(45) Date of Patent: Jun. 30, 2009

(54) POWER AMPLIFIER CIRCUIT FOR PEAK ENVELOPE MODULATION OF HIGH FREQUENCY SIGNAL

(75) Inventor: Seung Woo Kim, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 130 days.

(21) Appl. No.: 11/783,349

(22) Filed: Apr. 9, 2007

(65) Prior Publication Data
US 2008/0024214 A1   Jan. 31, 2008

(30) Foreign Application Priority Data
Jul. 27, 2006   (KR) .................... 10-2006-0070733

(51) Int. Cl.
*H03G 3/20*   (2006.01)
(52) U.S. Cl. .................. 330/136; 330/297; 330/171
(58) Field of Classification Search .............. 330/136, 330/297, 171
See application file for complete search history.

(56) References Cited

U.S. PATENT DOCUMENTS

| | | | | |
|---|---|---|---|---|
| 2,905,835 A | * | 9/1959 | Wray | .......................... 327/165 |
| 5,249,201 A | * | 9/1993 | Posner et al. | ................ 375/295 |
| 5,942,938 A | * | 8/1999 | Myers et al. | ................... 330/10 |
| 6,566,963 B1 | * | 5/2003 | Yan et al. | ..................... 330/311 |
| 6,788,151 B2 | * | 9/2004 | Shvarts et al. | ................ 330/297 |
| 6,853,245 B2 | * | 2/2005 | Kim et al. | ................ 330/124 R |
| 7,202,734 B1 | * | 4/2007 | Raab | .......................... 330/126 |
| 2004/0263254 A1 | | 12/2004 | Tahara et al. | |

FOREIGN PATENT DOCUMENTS

| | | |
|---|---|---|
| JP | 2002-198747 A | 7/2002 |
| KR | 20020000106 A | 1/2002 |
| KR | 20020064769 A | 8/2002 |
| KR | 20040095828 A | 11/2004 |

* cited by examiner

*Primary Examiner*—Patricia Nguyen
(74) *Attorney, Agent, or Firm*—Sughrue Mion, PLLC

(57) ABSTRACT

A power amplifier circuit for peak envelope modulation of a high frequency signal is provided. The power amplifier circuit includes a transformer which receives a first signal greater than a predetermined level of an envelope of a carrier signal to generate a transformed signal, and a transistor which operates based on the transformed signal, receives a second signal, which is generated based on the carrier signal and has a direct current component, and amplifies the second signal according to the transformed signal to output an output signal.

18 Claims, 9 Drawing Sheets

POWER AMPLIFIER CIRCUIT FOR PEAK ENVELOPE MODULATION OF HIGH FREQUENCY SIGNAL

CROSS-REFERENCE TO RELATED APPLICATION

This application claims priority from Korean Patent Application No. 10-2006-0070733, filed on Jul. 27, 2006, in the Korean Intellectual Property Office, the entire disclosure of which is incorporated herein by reference.

BACKGROUND OF THE INVENTION

1. Field of the Invention

Apparatuses consistent with the present invention relate to a radio frequency (RF) transmitter, and more particularly, to a power amplifier circuit which can effectively amplify a power by classifying an envelope of an input high frequency signal that corresponds to a high level and a low level, and controlling a voltage to be supplied to a power amplification end.

2. Description of Related Art

In a transmitter of a system for high speed wireless communication such as a mobile phone, a digital multimedia broadcasting (DMB) phone, a personal digital assistant (PDA), and the like, various transmission schemes including an envelope modulation, for example, a quadrature phase shift keying (QPSK) modulation, a quadrature amplitude modulation (QAM), and the like, have been adopted. For the transmitter, a power amplifier is utilized to amplify a high frequency signal containing certain information. An output of the power amplifier is transmitted to a correspondent system via an antenna.

FIG. 1 illustrates a structure of a related art power amplifier 100. Referring to FIG. 1, the power amplifier 100 includes a power voltage control circuit 110 and an amplification stage 120.

Generally, an input signal PIN is a carrier signal in a high frequency domain for high speed wireless communication. The input signal PIN is amplified by the amplification stage 120. The amplification stage 120 amplifies the input signal PIN using amplifiers in various stages. In this instance, an operating voltage level of the signal, amplified by the amplification stage 120, is controlled by the power voltage control circuit 110, and an output signal POUT is generated according to the controlled signal. The power voltage control circuit 110 receives an envelope signal VRAMP for specifying a voltage level of the output signal POUT, to control the operating voltage level of the amplified signal by the amplification stage 120.

The power voltage control circuit 110 amplifies the envelope signal VRAMP, having an envelope which is determined by modulation scheme, for example, QPSK modulation, QAM modulation, and the like, or eliminates a noise component which is introduced into the envelope signal VRAMP. Accordingly, the operating voltage level of the power amplifier 110 varies by the power voltage control circuit 100 according to the envelope size of the high frequency signal, and the output signal POUT of the high frequency signal is transmitted via an antenna.

A transistor is generally inserted to an end of the power voltage control circuit 110. Specifically, the output signal POUT is generated by mixing a transistor output at the end of the power voltage control circuit 110 with the amplified signal by the amplification stage 120. As described above, since an active device, such as the transistor, is utilized at the end of the power voltage control circuit 110 for signal mixing, a comparatively great amount of power loss and signal distortion occurs. Specifically, as shown in FIG. 2, when the signal distortion does not exist, i.e., in a normal state, the output signal POUT may be output in an envelope form shaped in a waveform 210. However, like a waveform 220, the output signal POUT is distorted in ranges where a signal level is greater than a predetermined level and less than the predetermined level due to non-linearity of the active device. Also, since the active device has a comparatively greater resistance than a passive device, power consumption is greater than the passive device.

Also, as shown in FIG. 3, a transistor Q1 is generally provided at an end of the amplification stage 120. A metal-oxide semiconductor field effect transistor (MOSFET), a heterojunction bipolar transistor (HBT), a bipolar junction transistor (BJT), and the like, may be utilized for the transistor Q1. The transistor Q1 in the form of an N-channel MOSFET receives an output signal of an amplifier in a previous stage, as an input signal. As shown in FIG. 4, the transistor Q1 shows an Ids-Vds characteristics according to a gate bias voltage $V_{GS}$ and a drain voltage $V_{DS}$ corresponding to an operating point voltage. Here, Vds corresponds to a voltage between a drain and a source of the transistor Q1, and Ids corresponds to a current between the drain and the source. As an example, the transistor Q1 operates on a load line 412 by considering available headroom. Specifically, the transistor Q1 operates on the load line 412 to be capable of covering the output signal POUT with a greater envelope level as shown in a waveform 420. However, when the output signal POUT has a small envelope level like a waveform 410, the transistor Q1 operates on a load line 411. Accordingly, a corresponding load line may be reduced by temporarily decreasing a drain voltage of the transistor Q1 in proportion to an envelope level with respect to the output signal POUT with the small envelope level like the waveform 410. As shown in FIG. 4, since the transistor Q1 generally operates around an operating point PP, a power loss increases.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above.

The present invention provides a power amplifier circuit which can control a voltage to be supplied to a power amplification end by classifying an envelope of an input high frequency signal into a high level and a low level using a passive device such as a transformer, to reduce a power loss and signal distortion in a transmitter of a wireless communication system.

The present invention also provides a method of amplifying a power of a high frequency signal, which can reduce a power loss and signal distortion by detecting an envelope of an input high frequency signal, extracting a peak envelope greater than a predetermined size from the detected envelope via a limiter, and supplying the peak envelope, as a supply voltage, to a power amplification end via a transformer.

According to an aspect of the present invention, there is provided a power amplifier circuit including: a transformer which receives a first signal greater than a predetermined level of an envelope of a carrier signal to generate a transformed signal; and a transistor which operates based on the transformed signal, receives a second signal, which is generated based on the carrier signal and has a direct current (DC)

component, and amplifies the second signal according to the transformed signal to output an output signal.

BRIEF DESCRIPTION OF THE DRAWINGS

The above and other aspects and advantages of the present invention will become apparent and more readily appreciated from the following detailed description of certain exemplary embodiments of the invention, taken in conjunction with the accompanying drawings of which.

DETAILED DESCRIPTION OF EXEMPLARY EMBODIMENTS OF THE INVENTION

Figure 1:
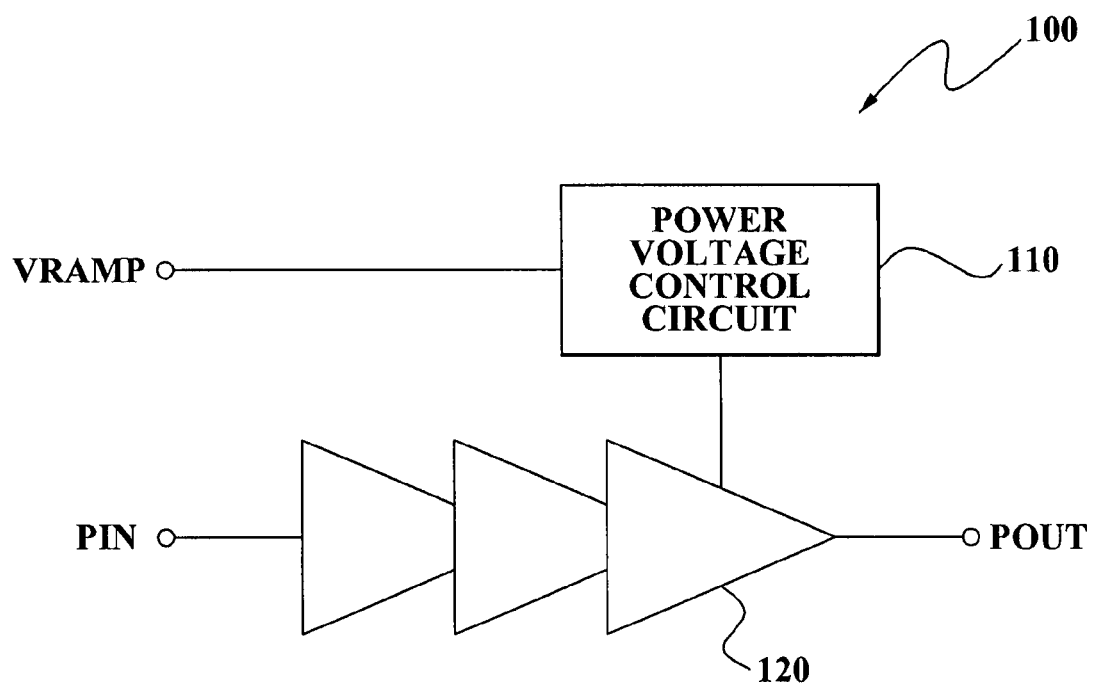
FIG. 1 is a diagram illustrating a structure of a related art power amplifier.
Figure 2:
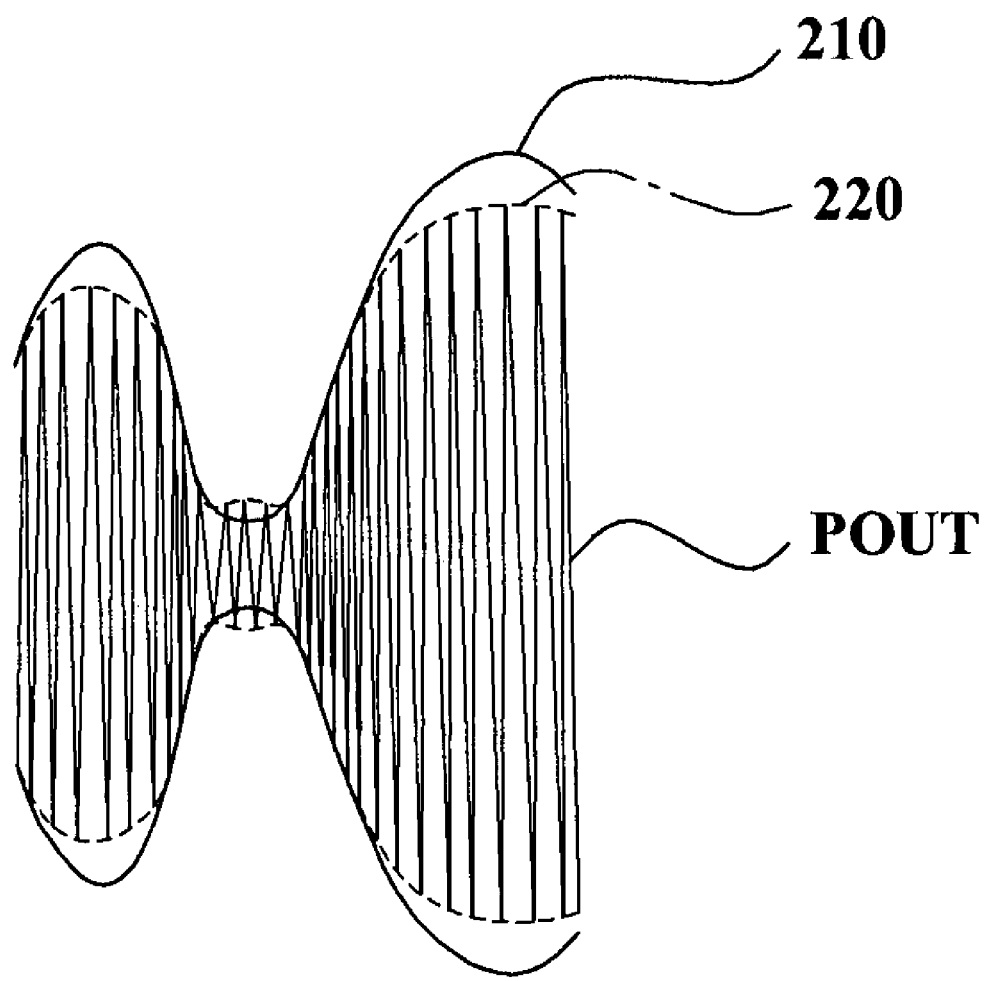
FIG. 2 is a diagram illustrating a distortion of envelope modulation of an output signal of the related art power amplifier of FIG. 1.
Figure 3:
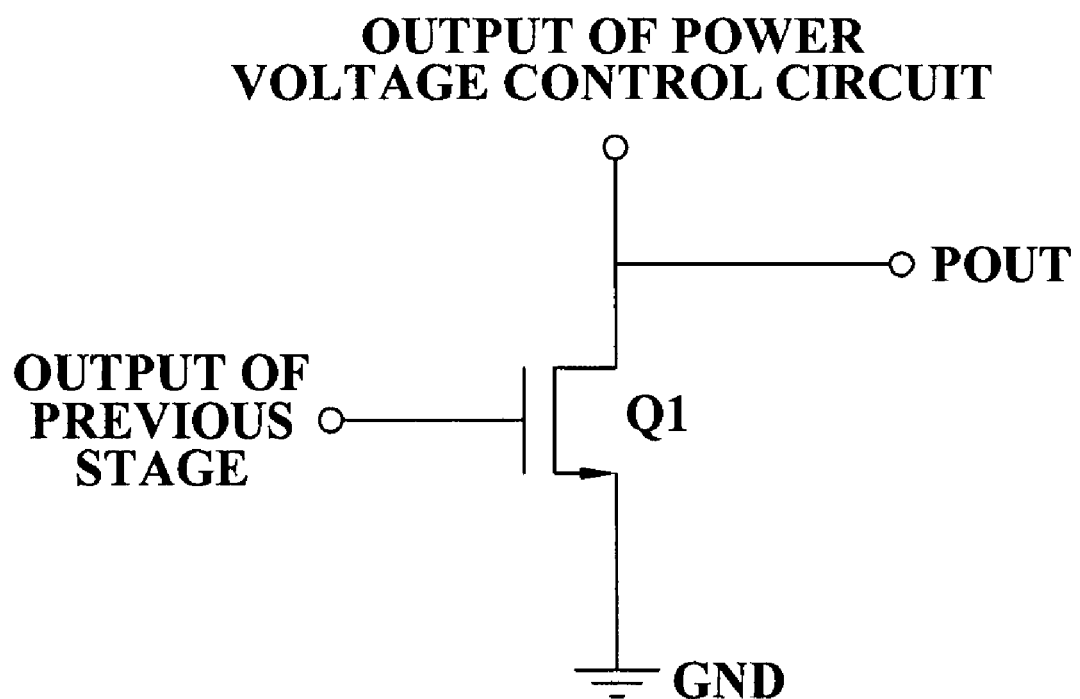
FIG. 3 is a diagram illustrating a transistor which is provided at an end of an amplification stage of the related art power amplifier illustrated in FIG. 1.
Figure 4:
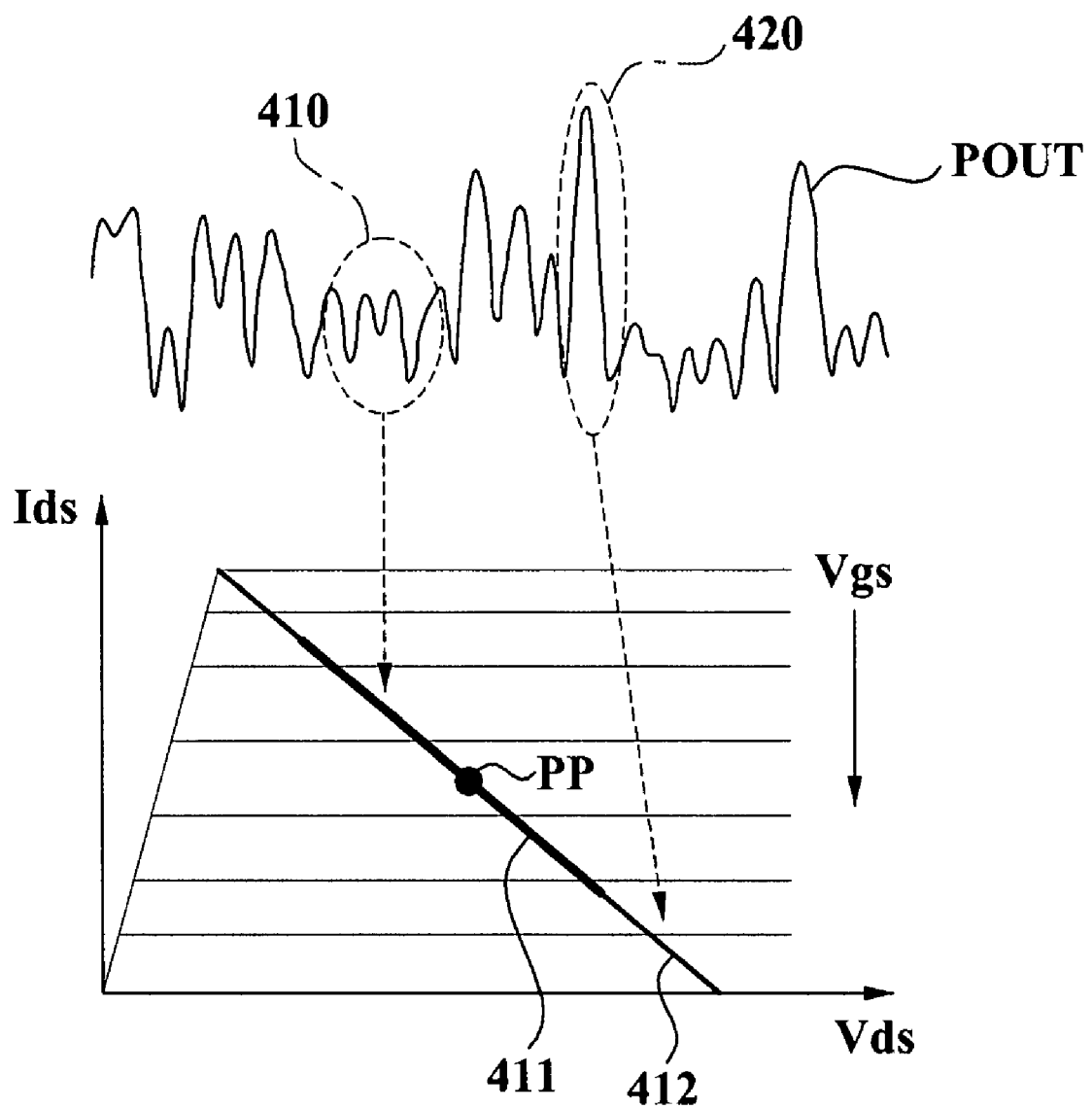
FIG. 4 is a diagram illustrating a load line on a current-voltage feature curve of a transistor as shown in FIG. 3.

Reference will now be made in detail to exemplary embodiments of the present invention, examples of which are illustrated in the accompanying drawings, wherein like reference numerals refer to like elements throughout. The exemplary embodiments are described below to explain the present invention by referring to the figures.

Figure 5:
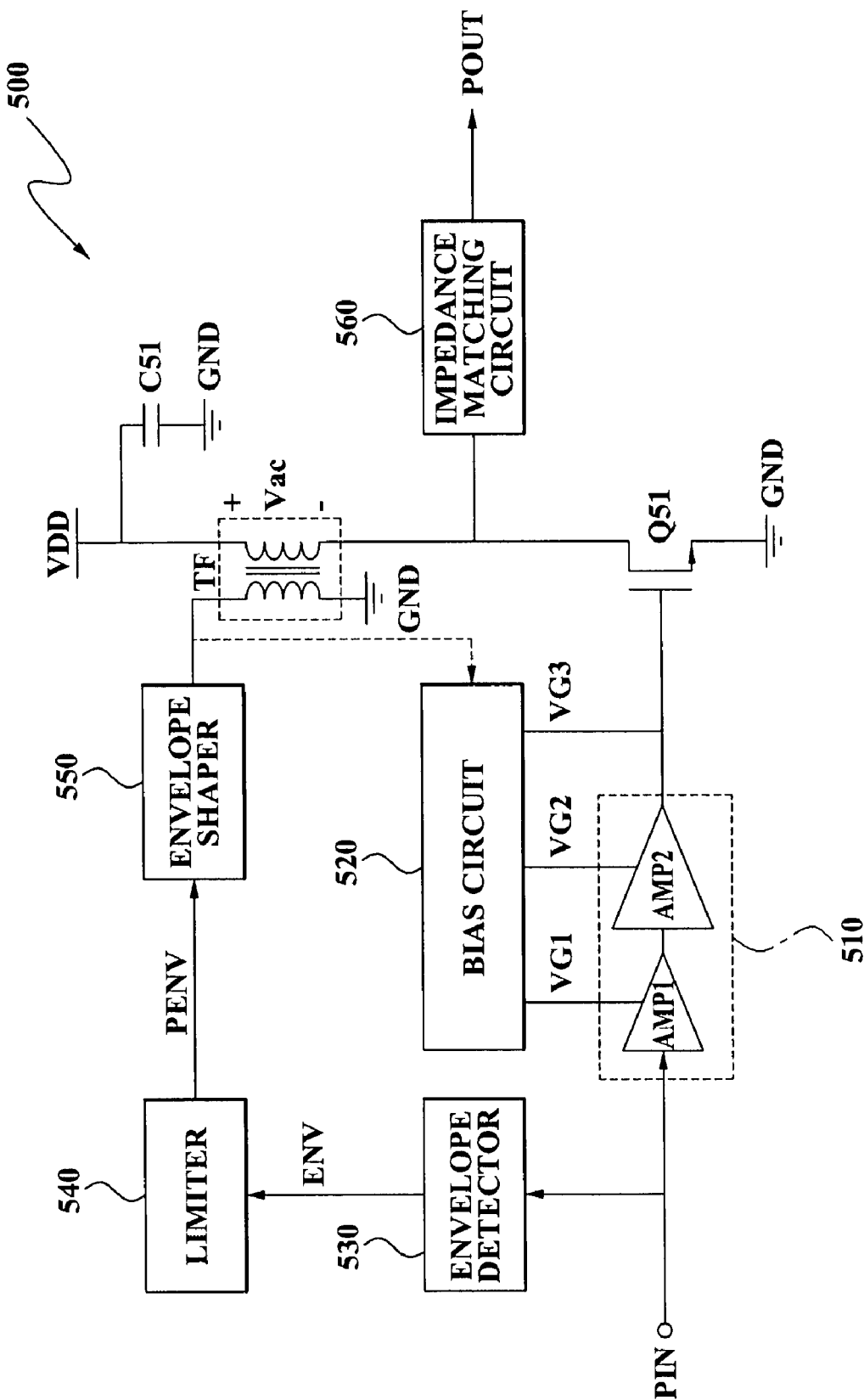
FIG. 5 is a diagram illustrating a power amplifier circuit according to an exemplary embodiment of the present invention.

FIG. 5 is a diagram illustrating a power amplifier circuit 500 according to an exemplary embodiment of the present invention. Referring to FIG. 5, the power amplifier circuit 500 includes a driver stage 510, a power amplification transistor Q51, a transformer TF, a bias circuit 520, an envelope detector 530, a limiter 540, an envelope shaper 550, an impendence matching circuit 560, and a capacitor C51. Signal waveforms as shown in FIGS. 6 and 7 are utilized for explaining operations of the power amplifier circuit 500.

The power amplifier circuit 500 according to the present exemplary embodiment receives an input high frequency signal PIN, and generates a signal, i.e., a power amplified signal POUT, which is generated by amplifying a level of the input high frequency signal PIN while maintaining an envelope of the input high frequency signal PIN. Specifically, the power amplifier circuit 500 classifies an envelope of the input high frequency signal PIN into a low level and a high level, and controls a voltage to be supplied to the power amplification transistor Q51 via the transformer TF, i.e., a passive device. More specifically, when the envelope of the input high frequency signal PIN has a high level greater than a predetermined threshold value, a high voltage is temporarily supplied to the power amplification transistor Q51. Conversely, when the envelope of the input high frequency signal PIN has a low level less than the threshold value, a small voltage at the level of the threshold value is supplied to the power amplification transistor Q51. Accordingly, a significant amount of power loss for generating the power amplified signal POUT may be reduced.

Figure 6:
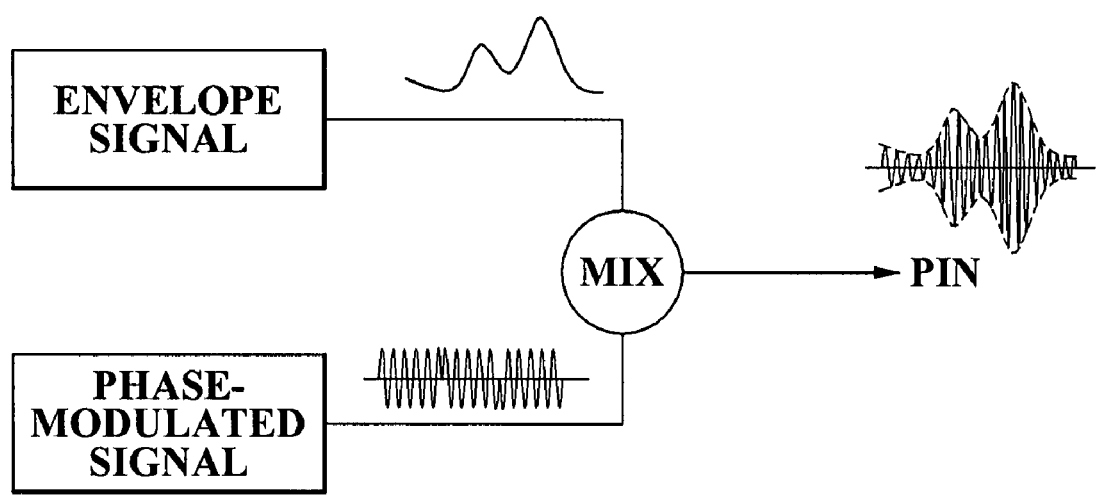
FIG. 6 is a diagram illustrating generation of input high frequency signals of FIG. 5.
Figure 7:
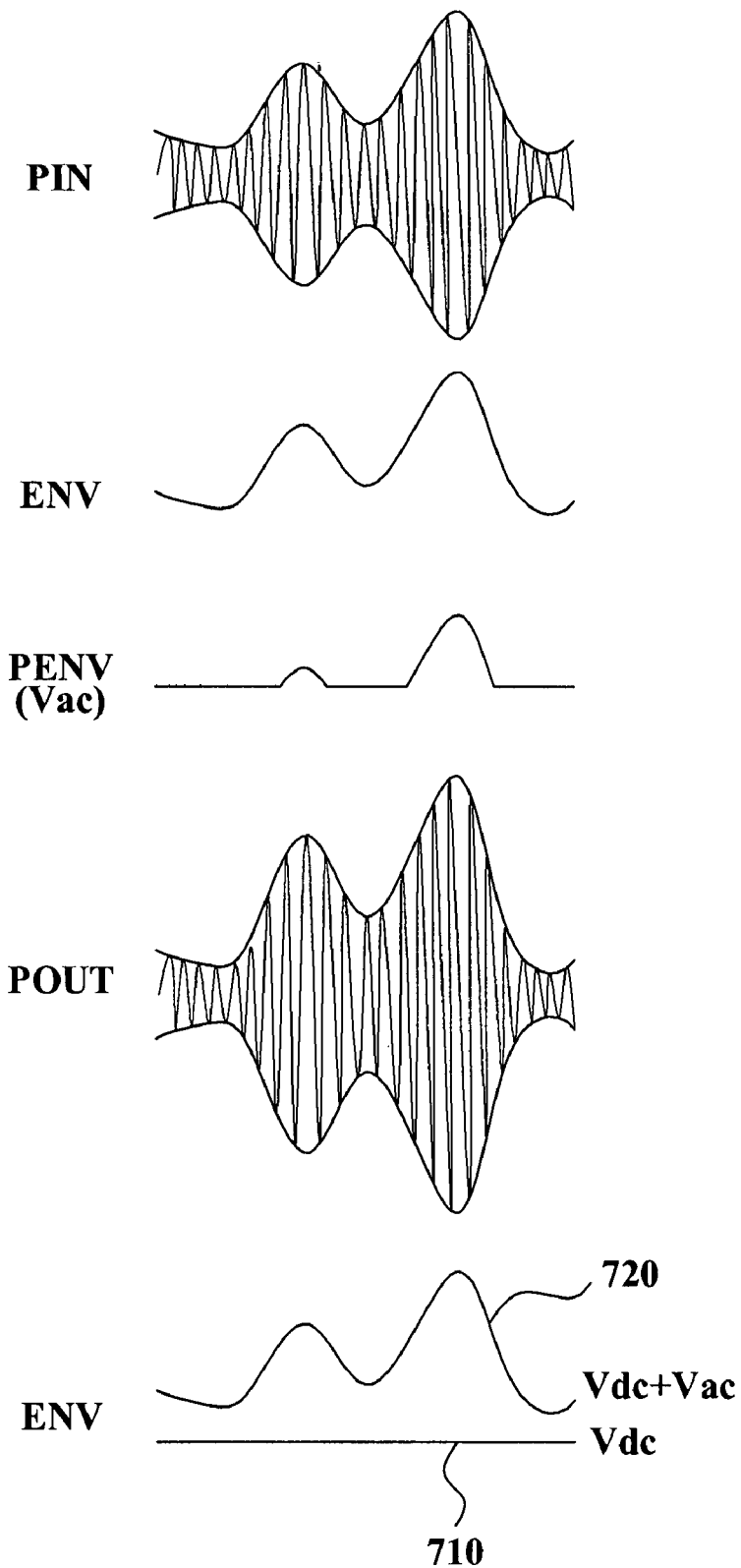
FIG. 7 is a signal waveform diagram for explaining an operation of the power amplifier circuit illustrated in FIG. 5.

The input high frequency signal PIN is a phase-modulated and envelope-modulated carrier signal which has a certain high frequency as shown in FIG. 6. The phase-modulated and envelope-modulated signal according to a signal modulation scheme of a wireless communication system, such as QPSK modulation, QAM modulation, and the like, may be generated in a circuit preceding the power amplifier circuit 500, and may be applied to the power amplifier circuit 500 as the input high frequency signal PIN. The phase-modulated signal may be a signal which is generated in a baseband and frequency up-converted from the baseband to a carrier domain by a predetermined frequency mixer. Also, the phase-modulated signal may be a constant envelope signal. The envelope-modulated signal is an analog signal which is determined according to a modulation scheme such as QPSK modulation, QAM modulation, and the like, and has a variable amplitude. Also, the envelope-modulated signal contains information to be transmitted from the transmitter with the phase-modulated signal.

The power amplifier circuit 500 may be applied to a polar modulation transmitter of a ubiquitous system or a wireless communication system, for example, a code division multiple access (CDMA) system, a global positioning system (GPS), a personal communication system (PCS), an international mobile telecommunication (IMT) 2000 system, a wireless broadband (WiBro) Internet system, a wireless local area network (WLAN) system, an ultra wideband (UWB) system, a World Interoperability for Microwave Access_(WiMAX) system.

In FIG. 5, the envelope detector 530 detects an envelope of the input high frequency signal PIN, and generates an envelope signal ENV as shown in FIG. 7. The envelope detector 530 may generate the envelope signal ENV by eliminating a high frequency component of the input high frequency signal PIN and extracting a low frequency component.

As shown in FIG. 7, the limiter 540 generates a peak envelope signal PENV which is a portion of the envelope signal ENV greater than a predetermined threshold value level. The limiter 540 may generate the peak envelope signal PENV by clipping a portion less than the threshold value level.

When the input high frequency signal PIN of a higher level than the threshold value level is detected, the peak envelope signal PENV is processed in the envelope shaper 550 before the peak envelope signal PENV is supplied to the transformer TF, i.e., a passive device. The envelope shaper 550 may eliminate the high frequency noise component by low pass filtering the peak envelope signal PENV via a predetermined filter. Also, the envelope shaper 550 may amplify the peak envelope signal PENV via a predetermined amplifier to control the amplitude of the peak envelope signal PENV.

The output signal of the envelope shaper 550, i.e., a signal which is generated by filtering and amplifying the peak envelope signal PENV, is input into the transformer TF, while maintaining an envelope shape of the peak envelope signal PENV. Specifically, signal portions of the output signal of the envelope shaper 550 that are greater than the threshold value level among envelopes of the input high frequency signal PIN are input into the transformer TF. The transformer TF is a current transformer which generates a transformed signal Vac according to a turns ratio of a second coil to a first coil.

In FIG. 5, two terminals of the first coil of the transformer TF respectively receive a first power source GND, for example, a ground, and an output signal of the envelope shaper 550. A first terminal of the second coil is connected with a second power source VDD, for example, 3.5 volts, and a second terminal of the second coil generates the transformed signal Vac. For a stable supply of the second power source. VDD, the capacitor C51 having a predetermined capacitance may be connected between the first power source GND and the second power source VDD.

The transistor Q51 may be an N-channel MOSFET. However, the transistor Q51 is not limited thereto, and may be formed in various types, such as a BJT, an HBT, and the like.

Figure 8:
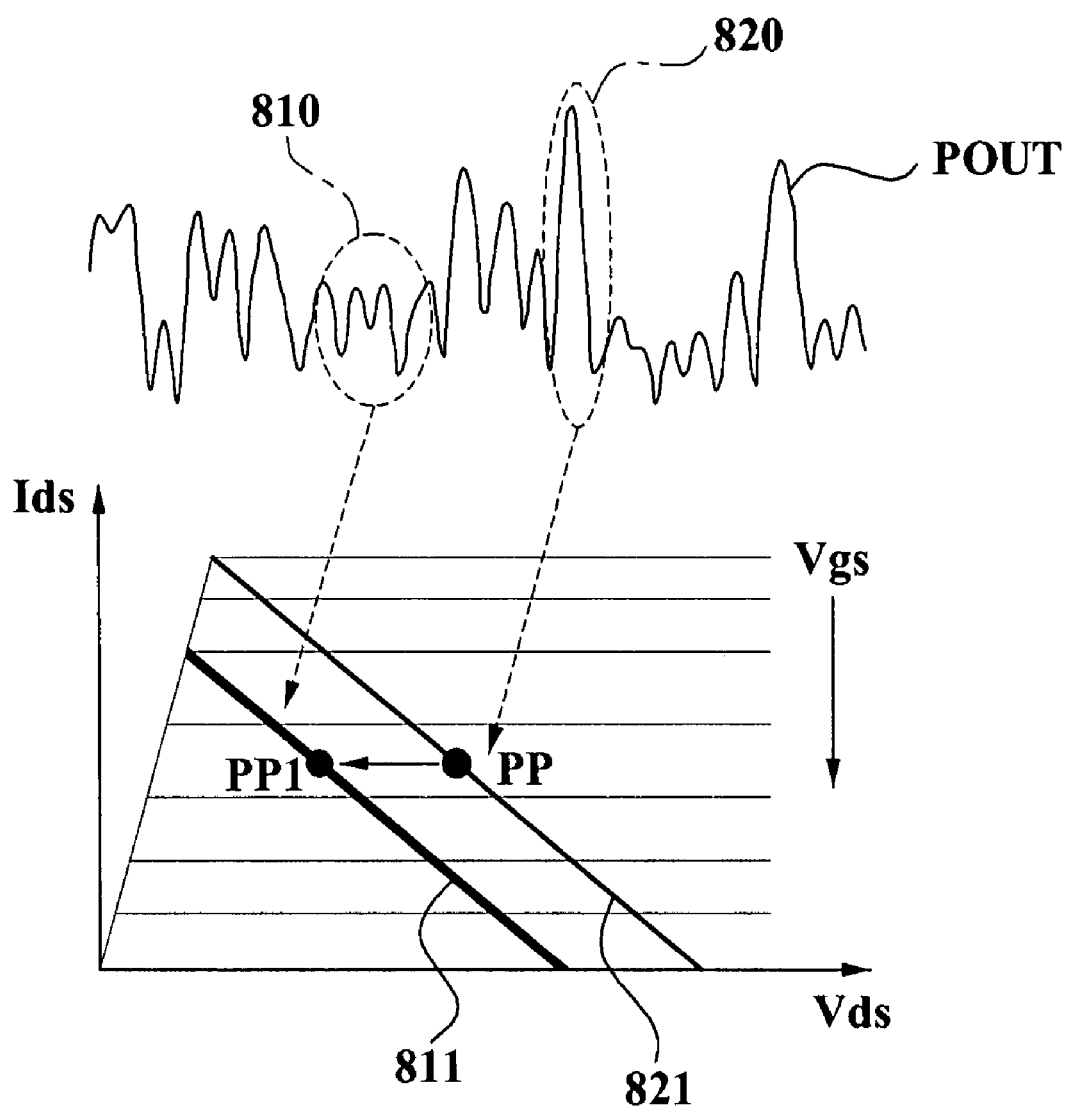
FIG. 8 is a diagram illustrating an example of a load line on a current-voltage feature curve of a power amplification transistor illustrated in FIG. 5.
Figure 9:
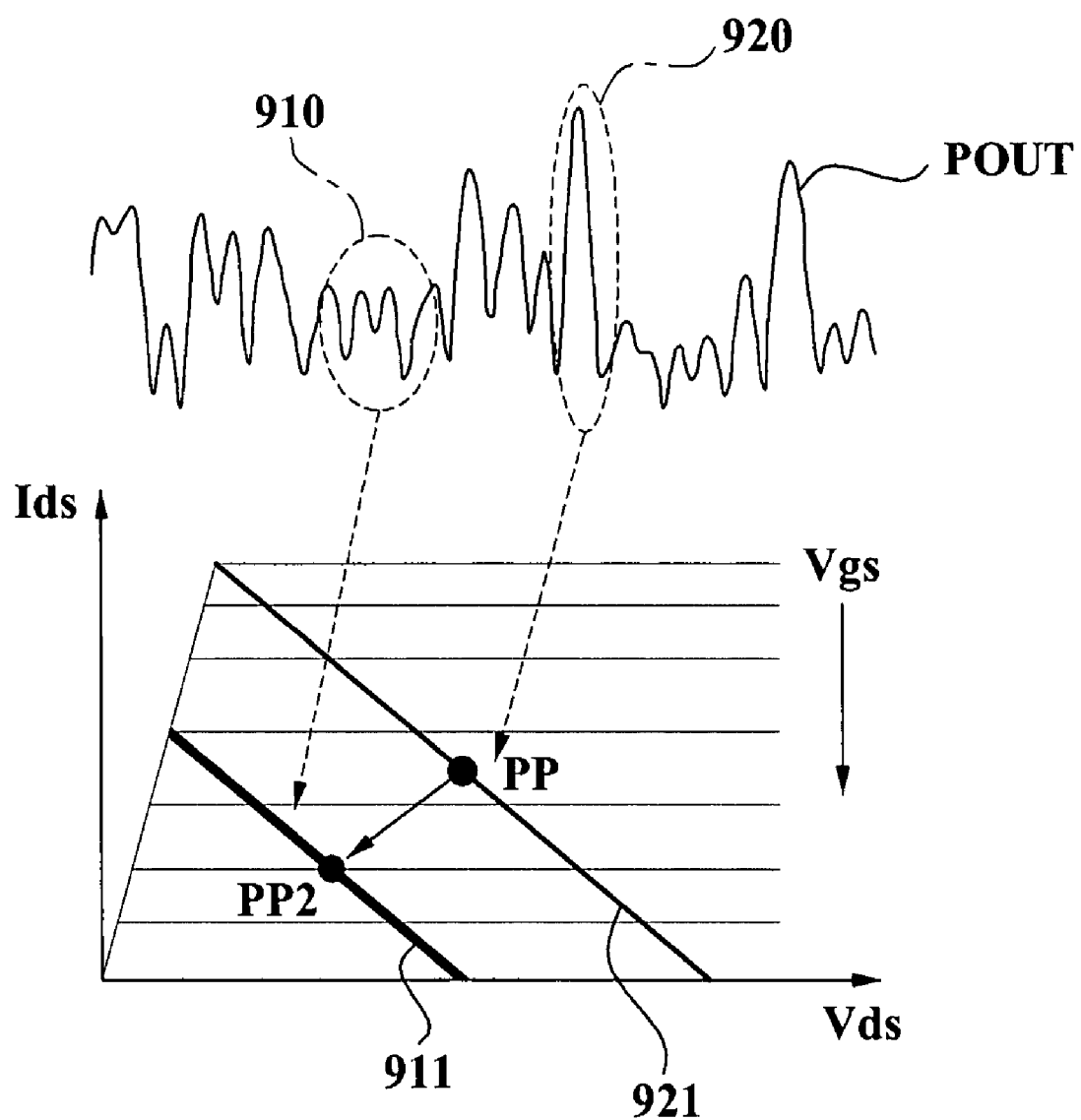
FIG. 9 is a diagram illustrating another example of a load line on a current-voltage feature curve of the power amplification transistor illustrated in FIG. 5.

The transformed signal Vac, which is generated in the transformer TF, is input into a first terminal among a drain and a source of the transistor Q51, for example, into the drain of the transistor Q51. A second terminal among the drain and the source of the transistor Q51, for example, the source is connected with the first power source GND. A gate of the transistor Q51 receives a signal which is generated by adding a direct current (DC) component VG3 generated from the bias circuit 520 and an output signal of the driver stage 510. Also, the bias circuit 520 may transmit a mixed signal of the DC component VG3 and a signal corresponding to the peak envelope signal PENV, for example, the transformed signal Vac, to the gate of the transistor Q51. Thus, as illustrated in FIG. 8 or FIG. 9, a gate voltage and a drain voltage corresponding to the operating point of the transistor Q51 vary in proportion to the peak envelope signal PENV. The drain terminal of the transistor Q51 outputs an power amplified signal of the gate input signal at the operating point. The power amplified signal by the transistor Q51 is output as the power amplified signal POUT, as shown in FIG. 5, via the impedance matching circuit 560. The impedance matching circuit 560 changes an antenna impedance, for example, 50 ohms into an impedance level required for the drain of the transistor Q51, to optimize a signal transmission. The impedance matching circuit 560 may include a resistor R, a capacitor C, an inductor L, and the like.

As described above, the transistor Q51 utilizes the transformed signal Vac as a drain operating point $V_{ds}$, and the generated signal in the bias circuit 520 as a gate operating point $V_{gs}$. Also, the transistor Q51 amplifies and outputs an amplification target signal which is input from the driver stage 510 via a terminal, for example, the drain of the transistor Q51, of the second coil of the transformer TF outputting the transformed signal Vac.

As described above, the signal, which is generated from the bias circuit 520 and transmitted to the gate of the transistor Q51, may be a mixture of the transformed signal Vac corresponding to the peak envelope signal PENV and a signal having the DC component VG3.

As an example, the transistor Q51 may show an Ids-Vds characteristics according to a voltage Vds between a drain of the transistor Q51 and the first power source GND, as shown in FIG. 8. Specifically, the transistor Q51 operates by using the transformed signal, which is supplied to the drain, as an operating point. Thus, the transistor Q51 temporarily operates on a load line 821 which has an average operating point PP in a portion greater than the threshold value level of the envelope of the input high frequency signal PIN, for example, in a waveform 820 of FIG. 8. Also, the transistor Q51 operates on a load line 811 which has an average operating point PP1 in a portion less than the threshold value level of the envelope of the input high frequency signal PIN, for example, in a waveform 810 of FIG. 8. As described above, since a voltage of the drain operating point $V_{ds}$ of the transistor Q51 is variable, it is possible to improve efficiency of the power amplifier. Also, even when the voltage is variable, the transistor Q51 may output the signal, which is generated by amplifying the voltage of the input frequency signal PIN, i.e., the power amplified signal POUT, without distortion, while maintaining an envelope shape of the input high frequency signal PIN.

Also, the bias circuit 520 generates DC components VG1 and VG2 for supplying to the driver stage 510 with the DC component, and generates VG3 for supplying to the gate of the transistor Q51, from a predetermined power source. As described above, a mixture signal of the DC component VG3 and the transformed signal Vac corresponding to the peak envelope signal PENV by the bias circuit 520 may be input into the gate of the transistor Q51. The driver stage 510 generates a signal by amplifying the input high frequency signal PIN using at least one of amplifiers AMP1 and AMP2 biased on the DC components VG1 and VG2. The output signal of the driver stage 510, i.e., the amplified signal of the input high frequency signal PIN is added to the DC component VG3, and the added signal is output to the gate of the transistor Q51.

As described above, in the power amplifier circuit 500 according to an exemplary embodiment of the present invention, since the transformer TF corresponding to the passive device is utilized, a resistance may be comparatively less, and linearity may be improved when compared with an active device. Also, a power loss for generating the power amplified signal POUT may be reduced, and the power amplified signal POUT may be clearly output without distortion. Specifically, an output of the transformer TF is classified into a high level and a low level of peak envelope of the input high frequency signal PIN. Thus, it is possible to make a load line of the transistor Q51 variable by using the output of the transformer TF as a voltage supplied to the drain of the transistor Q51 on a power amplification stage. The power loss may be further reduced.

Also, in order to improve performance of the power amplifier circuit 500 of FIG. 5, the bias circuit 520 of FIG. 5 may include a second transformer (not shown) which performs substantially identical operations as the transformer TF. As an example, as described in FIG. 5, the second transformer receives an output signal of the envelope shaper 550 and generates a second transformed signal having a similar envelope waveform to the transformed signal Vac. The second transformer may be provided between an output line of the DC component generated from the bias circuit 520 and the gate of the transistor Q51. Thus, as shown in FIG. 7, a waveform 720 that the DC component value, for example, VDC, and the second transformed signal, for example, Vac, are added with each other, i.e., "Vdc+Vac", may be biased to the gate of the transistor Q51. When the second transformed signal from the second transformer is mixed and biased to the gate of the transistor Q51, the second transformed signal may be more variable than when only the DC component value VDC is biased to the gate of the transistor Q51. Accordingly, power efficiency of the power amplifier circuit 500 may be further improved.

When utilizing the second transformer of the bias circuit 520 with the transformer TF connected with the drain, for example, as shown in FIG. 9, the transistor Q51 has an Ids-Vds characteristics according to the drain voltage Vds and the voltage Vgs between the gate and the first power source GND. Specifically, the transistor Q51 temporarily operates on a load line 921 which has an average operating point PP in a portion greater than the threshold value level of the envelope of the input high frequency signal PIN, for example, in a waveform 920 of FIG. 9. However, the transistor Q51 operates on a load line 911 which has an average operating point PP2 in a portion less than the threshold value level among the envelope of the input high frequency signal PIN, for example, in a waveform 910 of FIG. 9. In the present exemplary embodiment, since the load line moves in a diagonal direction, the load line may have the average operating point PP2 which is moved with a comparatively less power loss than the average operating point PP1 of FIG. 8.

As described above, in a power amplifier circuit and method according to an exemplary embodiment of the present invention, a voltage to be applied to a power amplification end is controlled in proportion to an envelope of an input high frequency signal of a high level greater than a predetermined reference value. Accordingly, a greater amount of power loss may be reduced.

Also, in the power amplifier circuit and method according to an exemplary embodiment of the present invention, envelope modulation for a high frequency signal is performed and a power amplified signal is generated by using a transformer with comparatively less resistance and higher linearity than an active device. Accordingly, power loss and signal distortion may be reduced.

Accordingly, a power amplifier circuit and method according to an exemplary embodiment of the present invention may be applied to systems for high speed wireless communication, for example, a mobile phone, a DMB phone, a PDA, or a transmitter of a ubiquitous system, to improve a performance of the systems.

Although a few exemplary embodiments of the present invention have been shown and described, the present invention is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A power amplifier circuit comprising:
   a transformer which receives a first signal which is a portion of an envelope of a carrier signal greater than a specified threshold level and generates a transformed signal; and
   a transistor which receives the transformed signal, receives a second signal, which is generated based on the carrier signal and has a direct current (DC) component, and amplifies the second signal according to the transformed signal to generate an output signal.

2. The power amplifier circuit of claim 1, wherein the transformed signal is input into one of a drain and a source of the transistor, and the output signal maintains the envelope of the carrier signal.

3. The power amplifier circuit of claim 1, wherein the carrier signal is a phase-modulated and envelope-modulated signal.

4. A power amplifier circuit, comprising:
   a transformer which receives a first signal greater than a level of an envelope of a carrier signal and generates a transformed signal;
   a transistor which receives the transformed signal, receives a second signal, which is generated based on the carrier signal and has a direct current (DC) component, and amplifies the second signal according to the transformed signal to generate an output signal;
   an envelope detector which detects the envelope of the carrier signal to generate an envelope signal;
   a limiter which receives the envelope signal and generates a peak envelope signal based on the envelope signal; and
   an envelope shaper which generates the first signal by low pass filtering and amplifying the peak envelope signal.

5. The power amplifier circuit of claim 4, wherein the limiter generates the peak envelope signal by clipping a portion of the envelope signal which is less than a threshold value level.

6. The power amplifier circuit of claim 1, wherein the transformer comprises first and second coils, each of two terminals of the first coil of the transformer is connected with a first power source and the first signal, respectively, and one of two terminals of the second coil of the transformer is connected with a second power source, and another terminal of the second coil outputs the transformed signal.

7. The power amplifier circuit of claim 6, wherein a gate of the transistor receives the second signal, the transformed signal is input into a drain of the transistor, a source of the transistor is connected with the first power source, and the drain generates the output signal.

8. The power amplifier circuit of claim 6, wherein a gate of the transistor receives the second signal, the transformed signal is input into a source of the transistor, a drain of the transistor is connected with the first power source, and the source generates the output signal.

9. The power amplifier circuit of claim 1, further comprising:
   a bias circuit which generates at least one direct current (DC) component from a power source; and
   a driver stage which comprises at least one amplifier, which is biased by the at least one DC component, and generates the second signal from the carrier signal.

10. The power amplifier circuit of claim 9, wherein:
    the bias circuit comprises a second transformer which receives the first signal and generates a second transformed signal, and
    the second signal corresponds to a mixture of the second transformed signal, and an analog signal having the at least one DC component.

11. The power amplifier circuit of claim 1, further comprising:
    an impedance matching circuit which is connected with the output signal of the transistor.

12. The power amplifier circuit of claim 1, wherein the transistor is an N-channel metal-oxide semiconductor field effect transistor (MOSFET).

13. The power amplifier circuit of claim 1, wherein the power amplifier circuit is comprised in a transmitter of a wireless communication system.

14. A power amplifier circuit comprising:
    a transformer which generates a transformed signal which is a portion of an envelope of the input signal that is greater than a specified threshold level; and
    a transistor which is connected with the transformer,
    wherein the transistor amplifies a power of an amplification target signal according to the transformed signal that is generated in the transformer.

15. The power amplifier circuit of claim 14, wherein the transformer generates the transformed signal by transforming the input signal according to a turns ratio of a second coil to a first coil.

16. The power amplifier circuit of claim 14, wherein the amplification target signal is generated based on the carrier signal, and comprises a direct current (DC) component.

17. The power amplifier circuit of claim 14, wherein the carrier signal is a phase-modulated and envelope-modulated signal.

18. A power amplifier circuit for amplifying a power of an input signal, the power amplifier circuit comprising:
    a transformer which transforms a signal which is a portion of an envelope of the input signal greater than a specified threshold level to generate a transformed signal; and a transistor which receives the transformed signal via a drain of the transistor, receives a signal with a direct current (DC) component via a gate of the transistor, and amplifies the signal with the DC component according to the transformed signal, wherein the signal with the DC component is generated based on the input signal.

* * * * *